(12) United States Patent
Gao et al.

(10) Patent No.: US 12,273,110 B2
(45) Date of Patent: Apr. 8, 2025

(54) LOW-TEMPERATURE COEFFICIENT RING OSCILLATOR, CHIP, AND COMMUNICATION TERMINAL

(71) Applicant: SHANGHAI VANCHIP TECHNOLOGIES CO., LTD., Shanghai (CN)

(72) Inventors: Chenyang Gao, Shanghai (CN); Yongshou Wang, Shanghai (CN); Sheng Lin, Shanghai (CN)

(73) Assignee: SHANGHAI VANCHIP TECHNOLOGIES CO., LTD., Shanghai (CN)

( * ) Notice: Subject to any disclaimer, the term of this patent is extended or adjusted under 35 U.S.C. 154(b) by 24 days.

(21) Appl. No.: 18/318,674

(22) Filed: May 16, 2023

(65) Prior Publication Data

US 2023/0291393 A1    Sep. 14, 2023

Related U.S. Application Data

(63) Continuation of application No. PCT/CN2021/130948, filed on Nov. 16, 2021.

(30) Foreign Application Priority Data

Nov. 16, 2020 (CN) .......................... 202011276399.8

(51) Int. Cl.
*H03K 3/03* (2006.01)
*H03L 7/099* (2006.01)

(52) U.S. Cl.
CPC ......... *H03K 3/0315* (2013.01); *H03L 7/0995* (2013.01)

(58) Field of Classification Search
CPC .... H03K 3/0315; H03K 3/011; H03L 7/0995; H03L 1/022
See application file for complete search history.

(56) References Cited

U.S. PATENT DOCUMENTS

| | | | |
|---|---|---|---|
| 2012/0194278 A1* | 8/2012 | Bugbee ................ | H03K 3/0315 331/8 |
| 2016/0065220 A1* | 3/2016 | Rana .................... | H03K 3/0322 331/1 R |

* cited by examiner

*Primary Examiner* — Jeffrey M Shin
(74) *Attorney, Agent, or Firm* — George Guosheng Wang; Upstream Research and Patent LLC

(57) ABSTRACT

Disclosed in the present invention are a low-temperature coefficient ring oscillator, a chip, and a communication terminal. The low-temperature coefficient ring oscillator comprises a temperature tracking compensation circuit, an inverter oscillation circuit, and a buffer shaping circuit. The temperature characteristics of the impedance of a PMOS tube and an NMOS tube in an inverter in the inverter oscillation circuit are tracked and compensated for by means of the impedance, along with temperature change, of a PMOS tube and a NMOS tube connected by a diode.

11 Claims, 6 Drawing Sheets

LOW-TEMPERATURE COEFFICIENT RING OSCILLATOR, CHIP, AND COMMUNICATION TERMINAL

BACKGROUND

Technical Field

The present disclosure relates to a low-temperature coefficient ring oscillator, and also relates to an integrated circuit chip including the low-temperature coefficient ring oscillator and a corresponding communication terminal, belonging to the technical field of radio frequency integrated circuits.

Related Art

With the development of integrated circuits and the increasing complexity of chip application environment, higher requirements are put forward for high-precision integrated circuits. Ring oscillator is a kind of widely used high-precision integrated circuit. Among them, ring oscillator is widely used in all kinds of integrated circuits, particularly phase-locked loop circuits, because it is easy to integrate. Due to varied application environment, there are many influencing factors, of which the temperature factor is the most common one. Therefore, it is necessary to minimize the influence of temperature on the ring oscillator. A typical ring oscillator is composed of several delay units connected in serials with a feedback connection. The delay unit can be composed of an inverter or a differential amplifier. In case of a delay unit that are formed by the inverters, the ring oscillator are consisted of cascaded inverters which are connected in serials with a feedback connection. A notable feature of the ring oscillator is that it consists of inverters of odd number connected in series to form a closed loop (that is, the last convert' output is feedback to the first convert' input). If the initial input is "1", then the final output is "0", and then the initial input turns to be "0", and consequently the final output becomes "1", thus realizing alternating oscillation output of "0" and "1" at a preset frequency.

The frequency of the clock signal that is output by the ring oscillator is determined by the delay time of a single-stage inverter. A single-stage inverter can be regarded as the charge and discharge of the output of the inverter to ground capacitance, and its delay time can be regarded as the charging time and discharging time to the ground capacitance. The charging and discharging time of the ground capacitance is determined by the resistance along the path of the charging and discharging and the ground capacitance. The resistance along the path of the charging and discharging is more affected by temperature. Therefore, reducing the influence of the temperature to the resistance along the path of the charging and discharging is a vital factor to realize the low-temperature coefficient ring oscillator.

SUMMARY

The primary technical problem to be solved by the disclosure is to provide a low-temperature coefficient ring oscillator.

Another technical problem to be solved by the disclosure is to provide an integrated circuit chip with the low-temperature coefficient ring oscillator.

Another technical problem to be solved by the disclosure is to provide communication terminal with the low-temperature coefficient ring oscillator.

In order to realize the above objectives, the disclosure adopts the following technical solutions:

According to the first aspect of embodiments of the disclosure, provided is a low-temperature coefficient ring oscillator, wherein comprises a temperature tracking compensation circuit, an inverter oscillation circuit and a buffer shaping circuit, an output of the temperature tracking compensation circuit being connected to an input of the inverter oscillation circuit, an output of the inverter oscillation circuit being connected to an input of the buffer shaping circuit.

Preferably, the inverter oscillation circuit comprises a plurality of cascaded stages that each includes a first inverter and a capacitor, the stages being of an odd number, the capacitors are of the same number of the stages;

The first inverters are cascaded with a feedback connection, and are connected to the temperature tracking compensation circuit, the first inverter in a last stage of the stages being connected to the buffer shaping circuit.

Preferably, the capacitors are MOS capacitance or MIM capacitance.

Preferably, the temperature tracking compensation circuit includes a temperature tracking compensation unit, a first enabling control unit, a voltage following unit, a first filter unit, and a second filter unit, the voltage following unit being connected to the temperature tracking compensation unit, the first enabling control unit, the first filter unit, and a bias current generation circuit, the second filter unit being connected to the voltage follower unit, the temperature tracking compensation unit, the first enabling control unit, the voltage follower unit, the first filter unit, and the second filter unit being grounded.

Preferably, the temperature tracking compensation unit includes a second PMOS transistor and a fourth NMOS transistor, which are connected in a diode connection mode.

Preferably, the temperature tracking compensation unit is a third PMOS transistor or a seventh NMOS transistor.

Preferably, the voltage following unit is a voltage follower or a voltage in-phase amplifier.

Preferably, the buffer shaping circuit includes a level conversion unit composed of second inverters.

Preferably, the temperature tracking compensation circuit, the inverter oscillation circuit and the buffer shaping circuit each includes a plurality of PMOS transistors and/or NMOS transistors, which function as enabling controllers to turn on or turn off the temperature tracking compensation circuit, the inverter oscillation circuit and the buffer shaping circuit.

Preferably, the temperature tracking compensation circuit generates a power supply voltage with temperature characteristic able to compensate oscillation frequency of the inverter oscillation circuit, according to temperature characteristic of the impedance of the first inverter in the inverter oscillation circuit.

According to the second aspect of embodiments of the disclosure, provided is an integrated circuit chip that comprise a low-temperature coefficient ring oscillator described above.

According to the third aspect of embodiments of the disclosure, provided is a communication terminal that comprises a low-temperature coefficient ring oscillator described above.

The low-temperature coefficient ring oscillator, chip and communication terminal provided by the present disclosure can track and compensate the temperature characteristics of the impedance of the PMOS transistors and NMOS transistors of the inverters in the inverter oscillation circuit by using the temperature dependent impedance of the PMOS transistors and NMOS transistors connected in a diode connection mode. Furthermore, based on a bias current with a preset temperature coefficient, by adjusting the proportional relationship of the temperature coefficients of the variables $\mu_n$, $\mu_p$, $Vth_n$, $Vth_p$ in the temperature tracking compensation circuit, the impedance temperature characteristics of the PMOS transistors and the NMOS transistors connected in a diode connection mode are converted into a voltage with compensation temperature characteristics, and then the voltage is input as the power supply voltage to the inverter oscillation circuit, so that the oscillation frequency of the clock signal output from the ring oscillator is almost unaffected by temperature.

DETAILED DESCRIPTION

Figure 1:
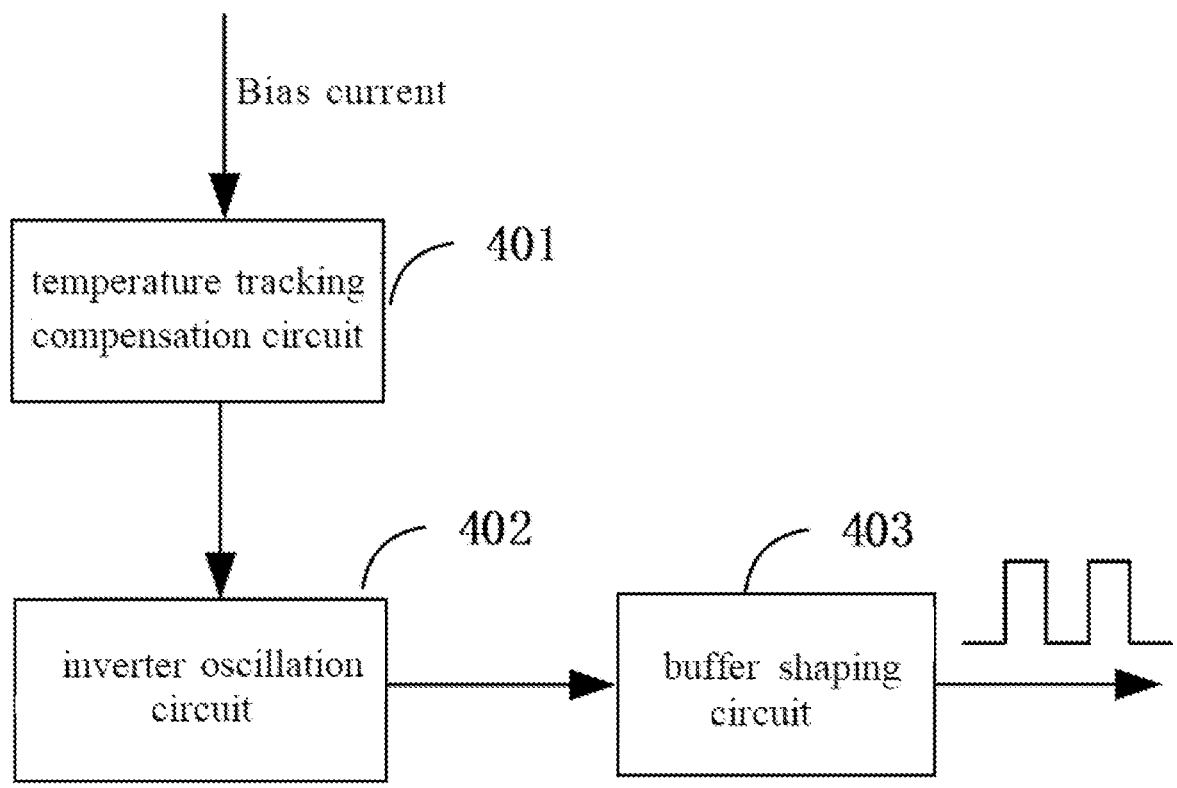
FIG. 1 is the working principle block diagram of the low-temperature coefficient ring oscillator provided by the embodiment of the disclosure.

The technical solutions of the disclosure are described below in detail in conjunction with the drawings and specific embodiments. In order to make the oscillation frequency of the output clock signal of the ring oscillator almost unaffected by temperature, and therefore improve the stability and reliability of the circuit system, as shown in FIG. 1, an embodiment of the present disclosure provides a low-temperature coefficient ring oscillator. The low-temperature coefficient ring oscillator includes a temperature tracking compensation circuit 401, an inverter oscillation circuit 402, and a buffer shaping circuit 403. An output end of the temperature tracking compensation circuit 401 is connected to an input end of the inverter oscillation circuit 402, and an output end of the inverter oscillation circuit 402 is connected to an input end of the buffer shaping circuit 403.

The inverter oscillation circuit 402 is used to generate a clock signal of preset oscillation frequency. The inverter oscillation circuit 402 includes a plurality of cascaded stages that each includes a first inverter and a capacitor, the stages being of an odd number, the capacitors are of the same number of the stages. The first inverters cascaded are connected in serials with a feedback connection. In addition, each of the first inverters are connected to the temperature tracking compensation circuit 401, and the first inverter in the last stage is connected to the buffer shaping circuit 403. In the embodiment shown in FIG. 2, the inverter oscillation circuit 402 includes first inverters 4020 in three stages and three capacitors that are cascaded in serials with a feedback connection. The first inverter of each stage includes a first NMOS transistor and a first PMOS transistor. The gate of the first NMOS transistor is connected with the gate of the first PMOS transistor, and the drain of the first NMOS transistor is connected with the drain of the first PMOS transistor, the source of the first PMOS transistor is connected with the temperature tracking compensation circuit 401, and the source of the first NMOS transistor is grounded. In addition, the drain of the first NMOS transistor and the drain of the first PMOS transistor of the first inverter at the last stage are connected together to be connected to the buffer shaping circuit 403. Wherein, the capacitance in the inverter oscillation circuit 402 may be MOS capacitance or MIM capacitance.

Figure 2:
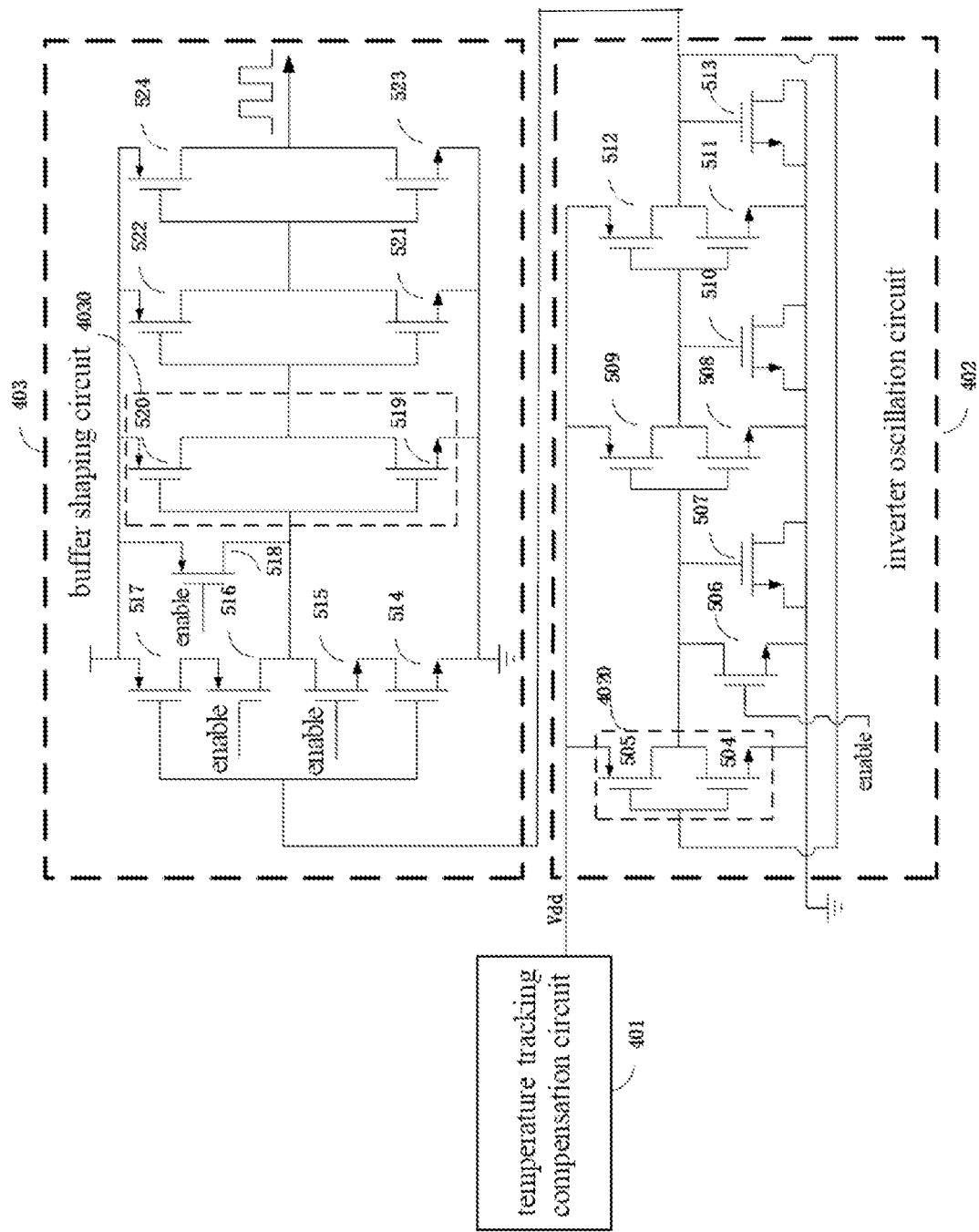
FIG. 2 is the circuit schematic diagram of the low-temperature coefficient ring oscillator provided by the embodiment of the disclosure.

As shown in FIG. 2, the first NMOS transistor 504 and the first PMOS transistor 505 constitute the first stage of the first inverter; the first NMOS transistor 508 and the first PMOS transistor 509 constitute the second stage of the first inverter; the first NMOS transistor 511 and the first PMOS transistor 512 constitute the third stage of inverter to obtain a three-stage first inverter. The first inverters cascaded are connected in serial with a feedback connection, that is, the drain of the first NMOS transistor 511 and the drain of the first PMOS transistor 512 in the third stage first inverter are connected together, and are connected with the gate of the first NMOS transistor 504 and the gate of the first PMOS transistor 505 in the first stage first inverter. The second NMOS transistor 507, the second NMOS transistor 510, and the second NMOS transistor 513 are connected in a MOS capacitive manner. Specifically, the gate of the second NMOS transistor 507 is connected to the drain of the first NMOS transistor 504, the drain of the first PMOS transistor 505, the gate of the first NMOS transistor 508. and the gate of the first PMOS transistor 509. The gate of the second NMOS transistor 510 is connected to the drain of the first NMOS transistor 508, the drain of the first PMOS transistor 509, the gate of the first NMOS transistor 511, and the gate of the first PMOS transistor 512. The gate of the second NMOS transistor 513 is connected with the drain of the first NMOS transistor 511 and the drain of the first PMOS transistor 512. The sources and drains of the second NMOS transistor 507, the second NMOS transistor 510 and the second NMOS transistor 513 are grounded respectively. Therefore, the inverter oscillation circuit 402 is constituted by the aforementioned first inverters 4020 in three stages and three capacitors that are cascaded in serials with a feedback connection.

In order to turn on or turn off the inverter oscillation circuit 402, one or more enabling control tubes are provided at a corresponding position of the inverter oscillation circuit 402. According to the commercial demand of the circuit, PMOS transistors or NMOS transistors are selectively connected at one or more positions of the inverter oscillation circuit 402 to function as the enabling controller so as to turn on or turn off the inverter oscillation circuit 402. In the embodiment shown in FIG. 2, a third NMOS transistor 506 between the first stage first inverter and the second NMOS transistor 507 in the inverter oscillation circuit 402, works as an enabling control tube. The gate of the third NMOS transistor 506 receives enable signal, the drain of the third NMOS transistor 506 is connected to the drain of the first NMOS transistor 504 and the drain of the first PMOS transistor 505 of the first stage first inverter. The source of the third NMOS transistor 506 is grounded.

Since the positive feedback condition must be satisfied for the inverter oscillation circuit 402 to realize oscillation, if the first inverter is used to form a delay unit, the first inverters must be of an odd number (N>1). Assuming that the delay time of the first stage first inverter is $t_d$, the inverter oscillation circuit 402 is formed by cascaded first inverters of odd number N (N>1) and capacitors with the same number, then the oscillation frequency of the inverter oscillation circuit 402 is $$t_d f = \frac{1}{2Nt_d}.$$

According to the formula, the delay time of the first inverters of each stage determines the oscillation frequency of the inverter oscillation circuit 402.

As shown in FIG. 2, the first NMOS transistor 504 and the first PMOS transistor 505 of the first inverter of each stage are switched on or off in turns by changing the enable signal to be high level or low level, so that the load capacitors (i.e., the second NMOS transistor 507, the second NMOS transistor 510 and the second NMOS transistor 513 shown in FIG. 2) are charged or discharged in turns. The time of capacitor being charged or discharged is the delay time of the first inverter of each stage.

Figure 3A:
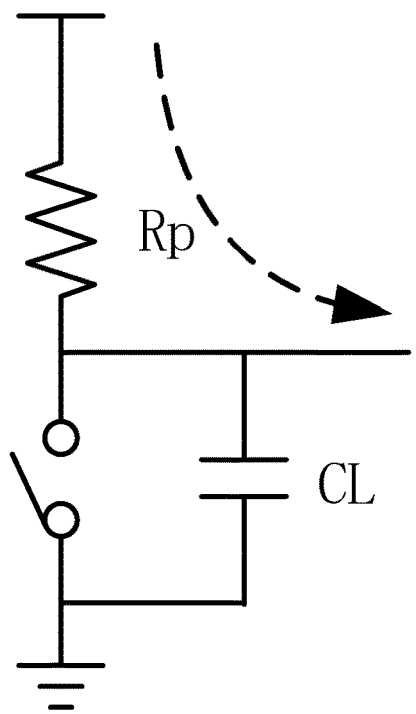
FIG. 3a is a schematic diagram of the inverter delay charging model of the inverter oscillation circuit in the low-temperature coefficient ring oscillator provided by the embodiment of the disclosure.
Figure 3B:
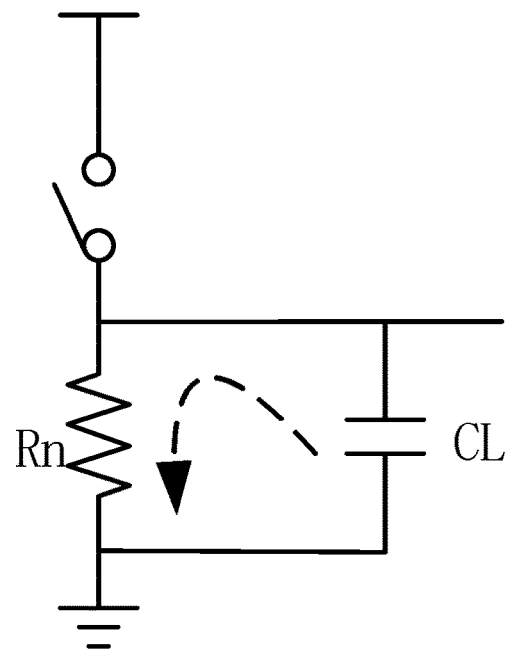
FIG. 3b is a schematic diagram of the inverter delay discharge model of the inverter oscillation circuit in the low-temperature coefficient ring oscillator provided by the embodiment of the disclosure.

FIG. 3a shows the delayed charging model of the inverter in the inverter oscillation circuit; FIG. 3b shows the delayed discharging model of the inverter in the inverter oscillation circuit. In the inverter oscillation circuit, when the first PMOS transistor of the first inverter is turned on, the first NMOS transistor of the first inverter is turned off, therefore the conducting equivalent resistance $R_P$ of the first PMOS transistor and the power supply charge the capacitor CL, wherein the conducting equivalent resistance $R_P$ is the resistance on the charging path. According to the following capacitor charging formula:

$$Vc = V_{dd} * \left(1 - e^{-\frac{t}{\tau}}\right) = V_{dd} * \left(1 - e^{-\frac{t}{R_p * CL}}\right) \quad (1)$$

Where, $V_c$ equals a voltage at the capacitor end, $V_o$ equals a power supply voltage, CL equals a capacitor, $\tau$ equals a time constant, t equals a charging time for the capacitor.

When the first NMOS transistor of the first inverter is turned on, the first PMOS transistor of the first inverter is turned off, and the conducting equivalent resistance RN and capacitance CL of the first NMOS transistor discharge to the ground, where the conducting equivalent resistance RN is the resistance on the charging path. According to the following capacitance discharge formula:

$$Vc = V_o * \left(-e^{-\frac{t}{\tau}}\right) = V_o * \left(-e^{-\frac{t}{Rn * CL}}\right) \quad (2)$$

Where, $V_c$ equals a voltage at the capacitor end, $V_o$ equals a voltage on the capacitor before discharge, CL equals a capacitor, $\tau$ equals a time constant, t equals a discharging time for the capacitor.

According to formulas (1) and (2), the delay time $t_d$=F($R_p*R_n$, $V_{dd}$, CL)=F ($K_p$, $K_n$, $V_{dd}$, CL), variables $$K_p = \frac{\mu_p C_{ox} W}{L},$$

and variables $$K_n = \frac{\mu_n C_{ox} W}{L}$$

of the first stage first inverter can be derived, where $\mu_p$ equals the electron mobility of the first PMOS transistor in the first inverter, $\mu_n$ equals the electron mobility of the first NMOS transistor in the first inverter, $C_{ox}$ equals the gate-oxide capacitance per unit area, W equals the width of the tube gate, and L equals the length of the tube gate. At this time, the delay time $t_d$ of the first stage first inverter can be regarded as a function of the variables $K_p$, $K_n$, $V_{dd}$, $CL_o$. Further, the oscillation frequency f the ring oscillator can also be regarded as a function of the variables $K_p$, $K_n$, $V_{dd}$, CL since the oscillation frequency $$f = \frac{1}{2Nt_d}.$$

The temperature coefficient TCF_f of the oscillation frequency can be obtained by calculating the partial derivative of temperature for this function $$f = \frac{1}{2Nt_d},$$

where TCF_f=F(TCF_$\mu_n$, TCF_$\mu_p$, TCF_Vth$_n$, TCF_Vth$_p$, TCF_V$_{dd}$). Thus, TCF_f can be regarded as a function of TCF_$\mu_n$, TCF_$\mu_p$, TCF_Vth$_n$, TCF_Vth$_p$, TCF_V$_{dd}$. In other words, the temperature characteristic of the oscillation frequency f is determined by the variables TCF_$\mu_n$, TCF_$\mu_p$, TCF_Vth$_n$, TCF_Vth$_p$, TCF_V$_{dd}$, where TCF_$\mu_n$ equals the temperature coefficients of the variable $\mu_n$, TCF_$\mu_p$ equals the temperature coefficients of the variable $\mu_p$, TCF_Vth$_n$ equals the temperature coefficients of the variable Vth$_n$, TCF_Vth$_p$ equals the temperature coefficients of the variable Vth$_p$, and TCF_V$_{dd}$, equals the temperature coefficients of the variable V$_{dd}$. $\mu_n$ equals the electron mobility of the first NMOS transistor of the first inverter, $\mu_p$ equals the hole mobility of the first PMOS transistor of the first inverter, Vth$_n$ equals the threshold voltage of the first NMOS transistor of the first inverter, Vth$_p$ equals the threshold voltage of the first PMOS transistor of the first inverter, and V$_{dd}$ equals the supply voltage of the first inverter.

It can be seen from the above that the impedances of the first PMOS transistor and the first NMOS transistor in the first inverter, and the capacitance in the inverter oscillation circuit 402 determine the oscillation frequency of the clock signal output by the inverter oscillation circuit 402. The impedances of the first PMOS transistor and the first NMOS transistor are greatly affected by temperature, while the capacitance is less affected by temperature. Therefore, by changing the proportional relationship of temperature coefficients of the variables $\mu_n$, $\mu_p$, Vth$_n$, Vth$_p$, the temperature coefficient offset compensations of TCF_$\mu_n$, TCF_$\mu_p$, TCF_Vth$_n$, TCF_Vth$_p$, TCF_V$_{dd}$ can be realized to compensate the temperature characteristics of the impedance of the first PMOS transistor and that of the impedance the first NMOS transistor. So that the oscillation frequency of the clock signal output by the low-temperature coefficient ring oscillator is almost unaffected by temperature. Even though the capacitance is greatly affected by temperature in some processes, the temperature characteristic of the capacitance value can be compensated by changing the proportional relationship of the temperature coefficient of the variables $\mu_n$, $\mu_p$, $Vth_n$, $Vth_p$.

Figure 4:
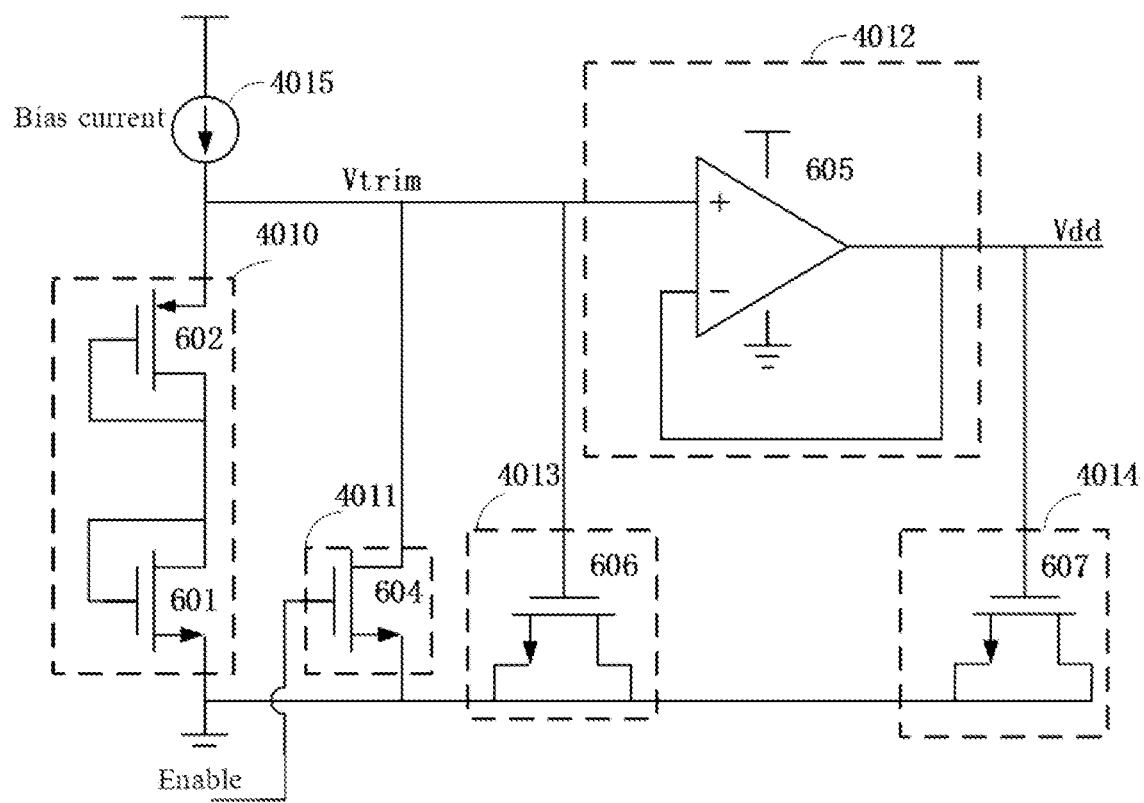
FIG. 4 is the first circuit diagram of the temperature tracking compensation circuit in the low-temperature coefficient ring oscillator provided by the embodiment of the disclosure.
Figure 5A:
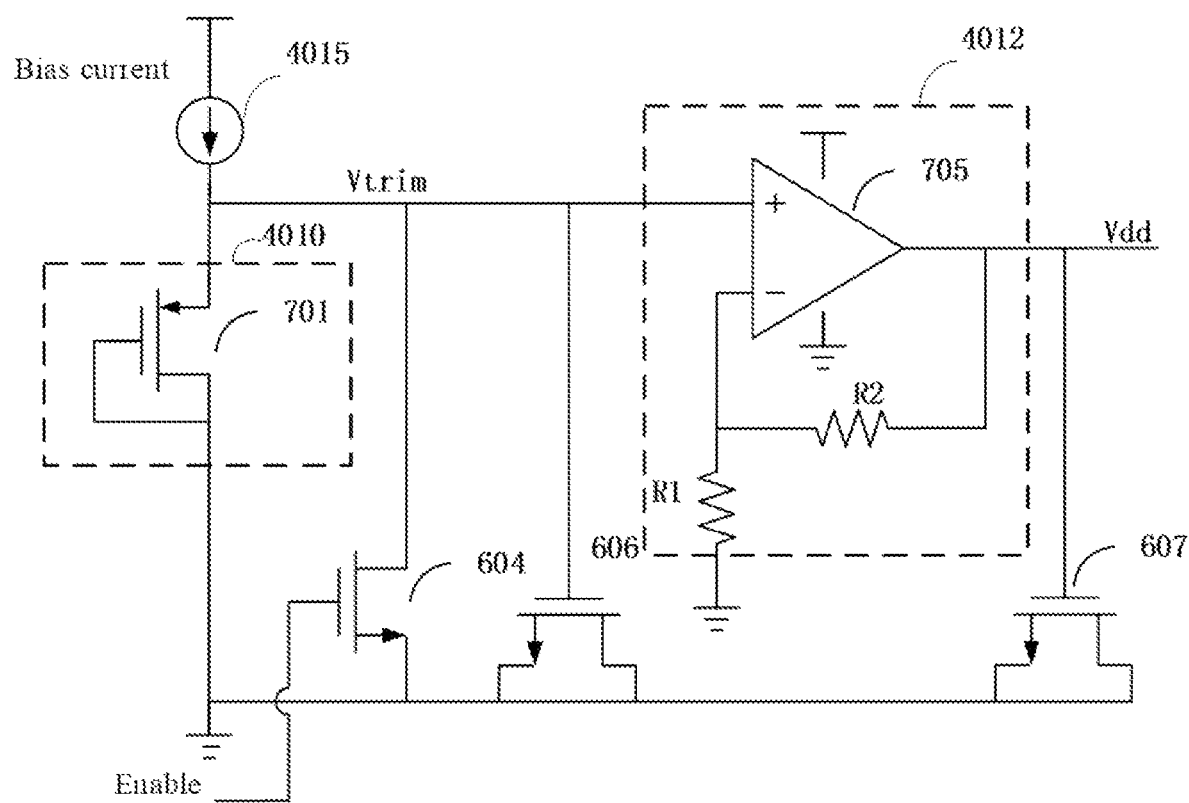
FIG. 5a is the second circuit diagram of the temperature tracking compensation circuit in the low-temperature coefficient ring oscillator provided by the embodiment of the present disclosure.
Figure 5B:
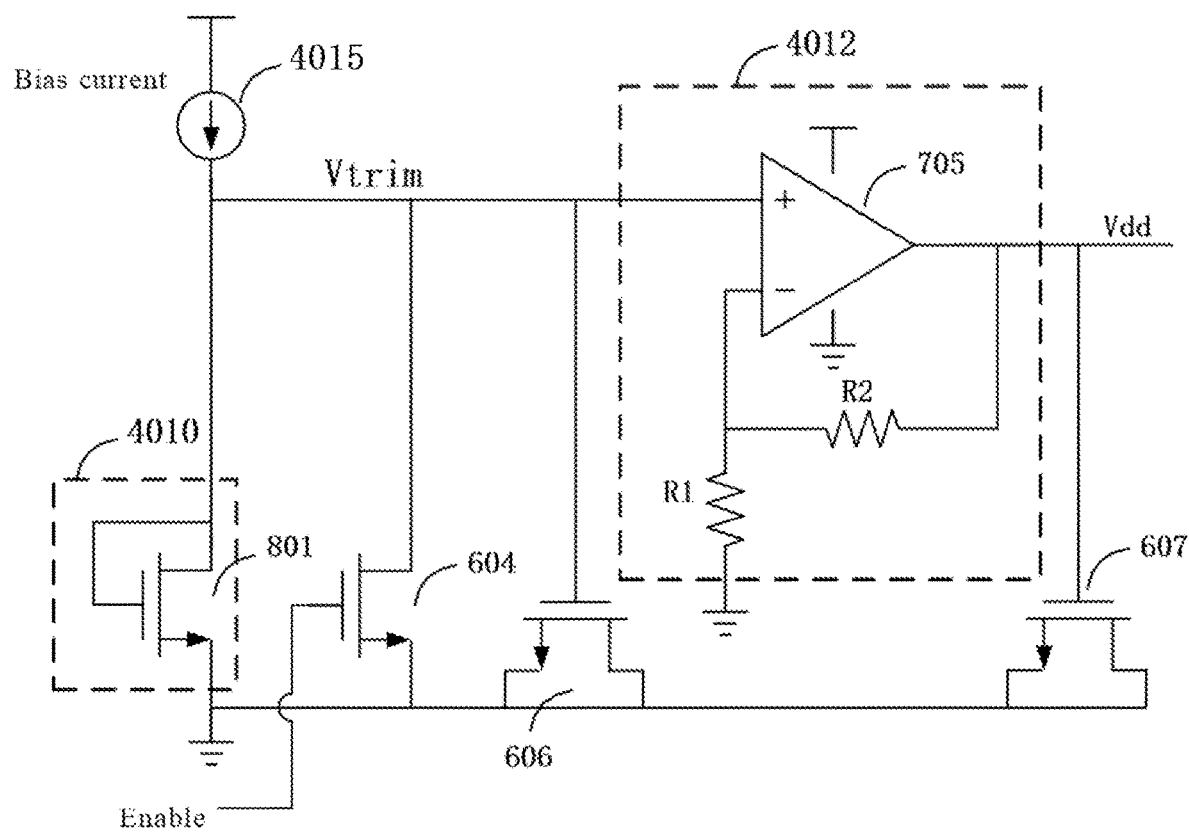
FIG. 5b is the third circuit diagram of the temperature tracking compensation circuit in the low-temperature coefficient ring oscillator provided by the embodiment of the present disclosure.

As shown in FIG. 4, FIG. 5a and FIG. 5b, the temperature tracking compensation circuit 401 includes a temperature tracking compensation unit 4010, a first enabling control unit 4011, a voltage following unit 4012, a first filter unit 4013 and a second filter unit 4014. The voltage following unit 4012 is connected with the temperature tracking compensation unit 4010, the first enabling control unit 4011, the first filter unit 4013 and the bias current generation circuit 4015. The second filter unit 4014 is connected to the voltage following unit 4012. The temperature tracking compensation unit 4010, the first enabling control unit 4011, the voltage following unit 4012, the first filter unit 4013 and the second filter unit 4014 are also connected to ground.

As shown in FIG. 4, the temperature tracking compensation unit 4010 includes a second PMOS transistor 602 and a fourth NMOS transistor 601, which are connected in a diode connection mode. That is, the gate of the second PMOS transistor 602 is connected to the drain thereof, and the gate of the fourth NMOS transistor 601 is connected to the drain thereof, the drains of the second PMOS transistor 602 and the fourth NMOS transistor 601 are connected together. The source of the second PMOS transistor 602 is respectively connected to the first enabling control unit 4011, the voltage following unit 4012, the first filter unit 4013 and the bias current generation circuit 4015. The source of the fourth NMOS transistor 601 is grounded. The bias current generated by the bias current generation circuit is a bias current with a specific temperature coefficient. The bias current can be a current with zero temperature coefficient or a current with positive or negative temperature coefficient, so as to better balance and adjust the temperature characteristics of the oscillation frequency of the clock signal output by the low-temperature coefficient ring oscillator.

It should be noted that the diode connection mode used by the PMOS and NMOS transistors can also be the grate-source connection mode, which is determined by the manufacturing process of the integrated circuit. In integrated circuits, the diodes used are equivalent to the combination of source-gate junction or drain-gate junction of MOS transistors, depending on the purpose.

Since the second PMOS transistor 602 and the fourth NMOS transistor 601 of the temperature tracking compensation unit 4010 are integrated on the same IC chip with the PMOS transistor and the NMOS transistor in the inverter oscillation circuit 402, the temperature changing trends of the second PMOS transistor 602 and the fourth NMOS transistor 601 are substantially consistent with the those of the PMOS transistor and the NMOS transistor in the inverter oscillation circuit 402. Therefore, the temperature characteristics of the impedances of the PMOS transistor and the NMOS transistor in the inverter oscillation circuit 402 can be tracked by using the impedances of the second PMOS transistor 602 and the fourth NMOS transistor 601, which vary with temperature.

Specifically, the temperature characteristics of impedances of the PMOS transistor and the NMOS transistor in the inverter oscillation circuit 402 are tracked according to the temperature-dependent impedances of the second PMOS transistors 602 and the fourth NMOS transistors 601 of the temperature tracking compensation unit 4010 in the following ways: the proportional relationship between the temperature coefficients of the variables $\mu_p$, $Vth_p$ of the second PMOS transistors 602 and the variables $\mu_n$, $Vth_n$ of the fourth NMOS transistors 601 is achieved by adjusting the aspect ratios of the second PMOS transistor 602 and the fourth PMOS transistor 601, respectively, so as to obtain impedance with a certain temperature coefficient; and the second PMOS transistor 602 and the fourth NMOS transistor 601 are biased based on the bias current with a specific temperature coefficient provided by the bias current generation circuit so as to generate a power supply voltage Vtrim with temperature characteristic able to compensate the oscillation frequency of the inverter oscillation circuit 402. The power supply voltage Vtrim is enhanced driven or amplified by the voltage following unit 4012 to provide the power supply voltage VDD for the inverter oscillation circuit 402. Thus, the proportional relationship between the temperature coefficient of the variable $\mu_p$, $Vth_p$ of the second PMOS transistor 602 and the temperature coefficient of the variable $\mu_n$, $Vth_n$ of the fourth NMOS transistor 601, can be adjusted to compensate the temperature coefficient of the variable $\mu_n$, $\mu_p$, $Vth_n$, $Vth_p$, $V_{dd}$ in the inverter oscillation circuit 402, so that the inverter oscillation circuit 402 outputs a clock signal whose oscillation frequency is almost unaffected by temperature.

As shown in FIG. 4, the voltage following unit 4012 may be implemented by a voltage follower 605. The voltage follower 605 is used to enhance driving of the supply voltage Vtrim generated by the temperature tracking compensation unit 4010 with the temperature characteristic of compensating the oscillation frequency of the inverter oscillation circuit 402.

As shown in FIGS. 5a and 5b, according to different commercial requirements, the voltage following unit 4012 can implemented selectively by a voltage-in-phase amplifier. The voltage-in-phase amplifier includes an operational amplifier 705, a first resistor R1 and a second resistor R2. The positive phase input of the operational amplifier 705 is connected with the source of the second PMOS transistor 701, the first enabling control unit 4011, the first filter unit 4013 and the bias current generation circuit. The inverting input end of the operational amplifier 705 is connected with an end of the first resistor R1 and an end of the second resistor R2, and the output end of the operational amplifier 705 is connected with the second filter unit 4014 and the source of the first PMOS transistor of the first inverter in the inverter oscillation circuit 402. The voltage in-phase amplifier amplifies the power supply voltage Vtrim with the temperature characteristic of compensating the oscillation frequency of the inverter oscillation circuit 402 generated by the temperature tracking compensation unit 4010, so as to supply the power supply voltage VDD to the inverter oscillation circuit 402. power supply voltage Vdd=R1+R2/R1·Vtrim.

As shown in FIGS. 5a and 5b, the temperature tracking compensation unit 4010 is alternatively implemented with a third PMOS transistor 701 or a seventh NMOS transistor 801. Specifically, the source of the third PMOS transistor 701 is connected with the first enabling control unit 4011, the voltage following unit 4012, the first filter unit 4013 and the bias current generation circuit 4015, and the gate and the drain of the third PMOS transistor 701 are grounded respectively. The gate and the drain of the seventh NMOS transistor 801 are respectively connected with the first enabling control unit 4011, the voltage following unit 4012, the first filter unit 4013 and the bias current generation circuit. The source of the seventh NMOS transistor 801 is grounded.

According to the temperature dependent impedance of the third PMOS transistor 701 or the seventh NMOS transistor 801 of the temperature tracking compensation unit 4010, the temperature characteristics of the PMOS transistors and NMOS transistors' impedances in the inverter oscillation circuit 402 are tracked. Thus, by adjusting the aspect ratio of the third PMOS transistor 701 or the seventh NMOS transistor 801 respectively, it is able to adjust the proportional relationship between the temperature coefficients of the variables $\mu_p$, $Vth_p$ of the third PMOS transistor 701 and the variables $\mu_n$, $Vth_n$ of the seventh NMOS transistor 801 so at to obtain the impedance with an expected temperature coefficient. Further the third PMOS transistor 701 or the seventh NMOS transistor 801 are biased with the current with a specific temperature coefficient, which is provided by the bias current generation circuit, so as to generate a supply voltage Vtrim with the temperature characteristic able to compensate the oscillation frequency of the inverter oscillation circuit 402. The supply voltage Vtrim is amplified by the voltage-in-phase amplifier to provide the supply voltage VDD for the inverter oscillation circuit 402. Thus, the proportional relationship between the temperature coefficient of the variable $\mu_p$, $Vth_p$ of the third PMOS transistor 701 and the variable $\mu_n$, $Vth_n$ of the seventh NMOS transistor 801 can be adjusted to compensate the temperature coefficient of the variable $\mu_n$, $\mu_p$, $Vth_n$, $Vth_p$, $V_{dd}$ in the inverter oscillation circuit 402, so that the inverter oscillation circuit 402 outputs a clock signal whose oscillation frequency is almost unaffected by temperature.

The first filter unit 4013 and the second filter unit 4014 are used to filter and stabilize the voltage. As shown in FIG. 4, FIG. 5a and FIG. 5b, the first filter unit 4013 can be implemented with a fifth NMOS transistor 606; the second filtering unit 4014 may be implemented with a sixth NMOS transistor 607. The gate of the fifth NMOS transistor 606 is respectively connected to the source of the second PMOS transistor 602, the drain of the eighth NMOS transistor 604 and the positive phase input of the voltage follower 605. The source and the drain of the fifth NMOS transistor are grounded respectively. The gate of the sixth NMOS transistor 607 is connected to the output of the voltage follower 605 and the source of the first PMOS transistor of each stage of the inverter oscillation circuit 402. The source and the drain of the sixth NMOS transistor 607 are grounded respectively.

The first enabling control unit 4011 is used to turn of or turn off the temperature tracking compensation circuit 401. The first enabling control unit 4011 could be designed at an appropriate position in the temperature tracking compensation circuit 401. That is, according to commercial requirements, PMOS transistors and/or NMOS transistors are configured to work as an enabling controller at one or more positions of the temperature tracking compensation circuit 401 to turn on or turn off the temperature tracking compensation circuit 401. As shown in FIG. 4, an eighth NMOS transistor 604, between the second PMOS transistor 602 of the temperature tracking compensation circuit 401 and the fifth NMOS transistor 606 of the first filter unit 4013, is configured to work as an enabling controller. The gate of the eighth NMOS transistor 604 is input an enable signal, the drain of the eighth NMOS transistor 604 is connected with the source of the second PMOS transistor 602, the gate of the fifth NMOS transistor 606 and the positive phase input of the voltage follower 605. The source of the eighth NMOS transistor 604 is grounded.

The buffer shaping circuit 403 is configured to shape the clock signal output by the inverter oscillation circuit 402, adjust the duty cycle and enhance the driving ability to meet the requirements of signal quality. It can generally be implemented by a level converter circuit or other circuits.

In one embodiment of the disclosure, as shown in FIG. 2, the buffer shaping circuit 403 is composed of cascaded multilevel second inverters. That is, the buffer shaping circuit 403 is composed of the level conversion unit that includes the second inverters. As shown in FIG. 2, the buffer shaping circuit 403 is illustrated by three stages of the second inverters 4030 that are cascaded. The second inverter 4030 of each stage includes a ninth NMOS transistor and a fourth PMOS transistor. The gate of the ninth NMOS transistor is connected with the gate of the fourth PMOS transistor, and the drain of the ninth NMOS transistor is connected with the drain of the fourth PMOS transistor. The source of the fourth PMOS transistor is input the power supply voltage. The source of the ninth NMOS transistor is grounded. In addition, the gate of the ninth NMOS transistor 514 of the first stage second inverter 4030 is connected with the gate of the fourth PMOS transistor 517 as the input of the first stage second inverter 4030, and is also connected with the drain of the first NMOS transistor 511 and the drain of the first PMOS transistor 512 of the last stage first inverter of the inverter oscillation circuit 402. The drain of the ninth NMOS transistor 523 and the drain of the fourth PMOS transistor 524 of the last stage second inverter 4030 are connected together as an output of the first stage second inverter 4030.

As shown in FIG. 2, the first stage second inverter includes the ninth NMOS transistor 514 and the fourth PMOS transistor 517; the second stage second inverter includes the ninth NMOS transistor 519 and the fourth PMOS transistor 520; the third stage second inverter includes the ninth NMOS transistor 521 and the fourth PMOS transistor 522, and the last stage second inverter includes the ninth NMOS transistor 523 and the fourth PMOS transistor 524. Thus, the second inverters in the present disclosure includes fourth stages of the second inverters. The buffer shaping circuit 403 includes the four stages of the second inverters cascaded. In the buffer shaping circuit 403, the duty cycle is adjusted by the aspect ratio of the ninth NMOS transistors and the fourth PMOS transistors in the first stage second inverter and the second stage second inverter, and the drive enhancement by the aspect ratio (width length ratio) of the ninth NMOS transistors and the fourth PMOS transistors in the third stage and the fourth stage second inverters.

In order to turn on or turn off the buffer shaping circuit 403, one or more enabling controller are provided at corresponding positions of the buffer shaping circuit 403. According to the commercial demand of the circuit, PMOS transistors or NMOS transistors are selectively connected at one or more positions of the buffer shaping circuit 403 to work as the enabling controller so as to turn on or turn off the buffer shaping circuit 403. As shown in FIG. 2, the tenth NMOS transistor 515 and the fifth PMOS transistor 516, between the ninth NMOS transistor 514 and the fourth PMOS transistor 517 of the first stage second inverter of the buffer shaping circuit 403, are configured to work as an enabling controller. The gate of the tenth NMOS transistor 515 is connected with the gate of the fifth PMOS transistor 516 to be input enable signal. The source of the tenth NMOS transistor 515 is connected with the drain of the ninth NMOS transistor 519, and the source of the fifth PMOS transistor 516 is connected with the drain of the fourth PMOS transistor 517. In addition, a sixth PMOS transistor 518, between the power supply voltage and an output of the first stage second inverter, functions as an enabling controller. The gate of the sixth PMOS transistor 518 is connected with the enable signal. The drain of the sixth PMOS transistor 518 is connected with the drain of the tenth NMOS transistor 515, the drain of the fifth PMOS transistor 516, the gate of the ninth NMOS transistor 519, and the gate of the fourth PMOS transistor 520.

In a conclusion, the temperature tracking compensation circuit 401 generates a power supply voltage with temperature characteristic able to compensate the oscillation frequency of the inverter oscillation circuit 402 according to the temperature characteristic of the impedance of the first inverter in the inverter oscillation circuit 402. The power supply voltage is output to the inverter oscillation circuit 402, so that the oscillation frequency of the clock signal output from the inverter oscillation circuit 402 is almost unaffected by temperature. The clock signal output from the inverter oscillation circuit 402 suffers shaping and drive enhancement by the buffer shaping circuit 403 to meet the requirements of signal quality.

In addition, the low-temperature coefficient ring oscillator provided in the embodiments of the present disclosure can be applied in an integrated circuit chip. The specific structure of the low-temperature coefficient ring oscillator in the IC chip will not be described in detail here.

The low-temperature coefficient ring oscillator can also be used in the communication terminal as an important part of the radio frequency (RF) integrated circuit. The communication terminal mentioned here means those are adapted for the mobile environment and are able to support GSM, edge and TD_SCDMA, TDD_LTE, FDD_LTE and other communication systems, which includes mobile phones, laptops, tablets, car computers, etc. In addition, the technical disclosure provided by the present disclosure is also applicable to other RF integrated circuit applications, such as base stations.

The low-temperature coefficient ring oscillator, chip and communication terminal provided by the embodiments of the present disclosure, track and compensate the temperature characteristics of the impedance of the PMOS transistors and the NMOS transistors in the inverter of the inverter oscillation circuit, by means of the temperature depending impedance of the PMOS transistors and the NMOS transistors connected in a diode connection mode. At the same time, based on the bias current of the specific temperature coefficient, by adjusting the proportional relationship of the temperature coefficients of the variables $\mu_n$, $\mu_p$, $Vth_n$, $Vth_p$ in the temperature tracking compensation circuit, the impedance temperature characteristics of the PMOS transistors and the NMOS transistors connected in a diode connection mode are converted into a voltage with compensation temperature characteristics, and then the voltage is used as the power supply voltage of the inverter oscillation circuit, so that the oscillation frequency of the clock signal output by the ring oscillator is almost unaffected by temperature.

The above describes in detail the low-temperature coefficient ring oscillator, chip, and communication terminal provided in the present disclosure. Any significant modifications made by a person skilled in the art without departing from essential content of the present disclosure shall fall within the protection scope of the patent right of the present disclosure.

What is claimed is:

1. A low-temperature coefficient ring oscillator, wherein comprises a temperature tracking compensation circuit, an inverter oscillation circuit and a buffer shaping circuit, an output of the temperature tracking compensation circuit being connected to an input of the inverter oscillation circuit, an output of the inverter oscillation circuit being connected to an input of the buffer shaping circuit, and the temperature tracking compensation circuit includes a temperature tracking compensation unit, a first enabling control unit, a voltage following unit, a first filter unit, and a second filter unit, the voltage following unit being connected to the temperature tracking compensation unit, the first enabling control unit, the first filter unit, and a bias current generation circuit, the second filter unit being connected to the voltage follower unit, the temperature tracking compensation unit, the first enabling control unit, the voltage follower unit, the first filter unit, and the second filter unit being grounded.

2. The low-temperature coefficient ring oscillator according to claim 1, wherein the inverter oscillation circuit comprises a plurality of cascaded stages that each includes a first inverter and a capacitor, the stages being of an odd number, the capacitors are of the same number of the stages;

the first inverters are cascaded with a feedback connection, and are connected to the temperature tracking compensation circuit, the first inverter in a last stage of the stages being connected to the buffer shaping circuit.

3. The low-temperature coefficient ring oscillator according to claim 2, wherein the capacitors are MOS capacitance or MIM capacitance.

4. The low-temperature coefficient ring oscillator according to claim 1, wherein the temperature tracking compensation unit includes a second PMOS transistor and a fourth NMOS transistor, which are connected in a diode connection mode.

5. The low-temperature coefficient ring oscillator according to claim 1, wherein the temperature tracking compensation unit is a third PMOS transistor or a seventh NMOS transistor;

a source of the third PMOS transistor being connected with the first enabling control unit, the voltage following unit, the first filter unit and the bias current generation circuit, and a gate and a drain of the third PMOS transistor being grounded respectively; or a gate and a drain of the seventh NMOS transistor being respectively connected with the first enabling control unit, the voltage following unit, the first filter unit and the bias current generation circuit, and a source of the seventh NMOS transistor being grounded.

6. The low-temperature coefficient ring oscillator according to claim 1, wherein the voltage following unit is a voltage follower or a voltage in-phase amplifier.

7. The low-temperature coefficient ring oscillator according to claim 1, wherein the buffer shaping circuit includes a level conversion unit composed of second inverters.

8. The low-temperature coefficient ring oscillator according to claim 1, wherein the temperature tracking compensation circuit, the inverter oscillation circuit and the buffer shaping circuit each includes a plurality of PMOS transistors and/or NMOS transistors, which function as enabling controllers to turn on or turn off the temperature tracking compensation circuit, the inverter oscillation circuit and the buffer shaping circuit.

9. The low-temperature coefficient ring oscillator according to claim 1, wherein the temperature tracking compensation circuit generates a power supply voltage with temperature characteristic able to compensate oscillation frequency of the inverter oscillation circuit, according to temperature characteristic of the impedance of the first inverter in the inverter oscillation circuit.

10. An integrated circuit chip, comprising a low-temperature coefficient ring oscillator according to claim 1.

11. A communication terminal, comprising a low-temperature coefficient ring oscillator according to claim 1.

* * * * *